United States Patent [19]

El Gamel

[11] Patent Number: 5,068,548

[45] Date of Patent: Nov. 26, 1991

[54] BICMOS LOGIC CIRCUIT FOR ASIC APPLICATIONS

[75] Inventor: Abbas El Gamel, Palo Alto, Calif.

[73] Assignee: SiArc, Palo Alto, Calif.

[21] Appl. No.: 524,207

[22] Filed: May 15, 1990

[51] Int. Cl.⁵ .................. H03K 19/01; H03K 19/003; H03K 19/082; H03K 19/094

[52] U.S. Cl. ................................. 307/446; 307/570; 307/469; 364/716

[58] Field of Search ................ 307/446, 570, 465–469, 307/473; 365/177; 364/716

[56] References Cited

U.S. PATENT DOCUMENTS

| 4,649,294 | 3/1987 | McLaughlin | 307/446 |
| 4,701,642 | 10/1987 | Pricer | 307/446 |
| 4,791,320 | 12/1988 | Kawata et al. | 307/446 |
| 4,804,868 | 2/1989 | Masuda et al. | 307/446 |

OTHER PUBLICATIONS

"BiCMOS Circuit Technology for a High—Speed SRAM," by Douseki et al., IEEE Journal of Solid—State Circuits, vol. 23, No. 1, Feb. 1988.
"Characterization of Speed and Stability of BiNMOS Gates with a Bipolar and PMOSFET Merge Structure," by Momose et al., published in IEDM, 1990.
A. Watanabe, "Future BiCMOS Technology for Scaled Supply Voltage," 1989, IEEE IEDM, pp. 16.5.1–16.5.4.
T. Hanibuchi, "A Bipolar—PMOS Merged Basic Cell for 0.8 um BiCMOS Sea—of—Gates," IEEE 1990 CICC, pp. 4.2.1–4.2.4.
K. Kumagai, "A 150 K Gate 250 ps BiCMOS SOG with an Emitter—Followed CMOS (EMOS) Cell," IEEE 1990 CICC, pp. 4.3.1–4.3.4.
A. Alverez, "BiCMOS Technology and Applications," pp. 237–238, After Feb. 16, 1989.
A. El Gamal (Applicant), "BiNMOS: A Basic Cell for BiCMOS Sea—of—Gates," Paper (4 pages).
T. Hayashi, "SDC Cell— A Novel CMOS/BiCMOS Design Methodology for Mainframe Arithmetic Module Generation," IEEE 1989, CICC, May 15, 1989, pp. 17.7.1–17.7.4.
W. Chin, "Push—Pull Driver Using Bipolar and Complementary Metal—Oxide Semiconductor Devices,"
IBM Technical Disclosure Bulletin, vol. 16, No. 11, Apr. 1974, pp. 3570–3571.
W. Pricer, "Combination CMOS/Bipolar Driver for High Capacitance,+ IBM Technical Disclosure Bulletin," vol. 27, No. 4A, Sep. 1984, pp. 1974–1975.
T. Sunaga, "Merged Bipolar—CMOS Device," IBM Technical Disclosure Bulletin, vol. 28, No. 8, Jan. 1986, pp. 3558–3561.
A. Wong et al., "A High Density BiCMOS Direct Drive Array," IEEE 1988 Custom Integrated Circuits Conference, pp. 20.6.1–20.6.3.
H. Fukuda et al., "A BiCMOS Channelless Masterslice with On—Chip Voltage Converter," International Solid State Circuits Conference 1989, Feb. 16, 1989, pp. 176–177.
El Gamel, Abbas et al., "BiNMOS: A Basic Cell for BiCMOS—Sea—of—Gates", dated May 15, 1989.
Watanabe et al., "Future BiCMOS Technology for Scaled Supply Voltage", Dec. 30, 1989 in IEDM'89.

Primary Examiner—Stanley D. Miller
Assistant Examiner—David R. Bertelson
Attorney, Agent, or Firm—Skjerven, Morrill, MacPherson, Franklin & Friel

[57] ABSTRACT

In one embodiment of the invention, an inverter inverts an input signal and provides this inverted input signal into the base of an NPN bipolar transistor, acting as a pull-up device, whose collector is coupled to a positive power supply voltage. The input signal coupled to the input of the inverter is also coupled to the gate of a large N-channel MOSFET, acting as a pull-down device, having its drain coupled to the emitter of the bipolar transistor and its source coupled to ground. The common node of the bipolar transistor and the N-channel MOSFET provides the output signal of the driver. This driver uses much less area than a standard two-bipolar transistor BiCMOS driver with substantially equal performance. A small P-channel MOSFET having its gate connected to the input signal may be connected across the base and emitter of the bipolar transistor to provide a full output voltage at the output of the driver.

26 Claims, 4 Drawing Sheets

ID=5,068,548

BICMOS LOGIC CIRCUIT FOR ASIC APPLICATIONS

CROSS-REFERENCE TO RELATED APPLICATION

This application relates to application Ser. No. 07/524,183, entitled "Basic Cell for BiCMOS Gate Array," by Abbas El Gamal, filed herewith and incorporated herein by reference.

FIELD OF THE INVENTION

This invention relates to integrated circuits and in particular to BiCMOS driver circuits for use in macrocells for Application Specific Integrated Circuits.

BACKGROUND OF THE INVENTION

In an integrated circuit, CMOS transistors are frequently used to keep power consumption of the integrated circuit to a minimum. These CMOS transistors may be used as building blocks to create a wide variety of logic circuits Since many CMOS transistors are formed on a single die, it is desirable to make the CMOS transistors very small, resulting in these CMOS transistors having only low current handling capability. To increase the low current output signal of CMOS transistors in order to overcome the parasitic capacitance, inductance, and resistance of conductors and components connecting the output of the CMOS transistors to a subsequent stage, drivers are typically incorporated throughout the integrated circuit to receive the low current output of the CMOS transistors and output a much higher current to drive one or more subsequent stages.

One typical use of CMOS transistors is in programmable gate arrays, including sea of gates, where the various input and output terminals of a plurality of low current CMOS transistors grouped within cells are programmably interconnected, using mask, electrical, or laser programming techniques, to form any number of logic circuits (macrocells). However, due to the low current output of the individual CMOS transistors, in order to drive a relatively high capacitance load, such as in the case of a fan out, a plurality of CMOS transistors must be connected in parallel to increase the current output and, thus, ensure high speed and reliable operation of the integrated circuit.

A faster and more area efficient means for driving high capacitance loads is to drive the loads with bipolar transistors. Such circuits, which have become increasingly popular, are generally known as BiCMOS circuits.

Typically, in each cell of a programmable BiCMOS gate array comprising a plurality of CMOS transistors, two bipolar devices are used as the BiCMOS driver in a totem-pole configuration as shown in the macrocell of FIG. 1. Representative channel widths and channel lengths of the MOSFETs are shown. Pull-up and pull-down bipolar transistors are used frequently as driver transistors instead of large MOSFETs due to their fast switching speeds and low parasitic capacitance.

The representative prior art circuit of FIG. 1 shows a CMOS device comprising low current handling transistors Q1 and Q2 having gates coupled to input terminal 8. N-channel low current handling transistors Q3 and Q4 are coupled in series, with the gate of transistor Q3 coupled to input terminal 8 and the gate of transistor Q4 coupled to the output of the CMOS device. Also, coupled to the output of the CMOS device is the base of high current NPN bipolar transistor Q5, acting as a pull-up device. The common node of transistors Q3 and Q4 is coupled to the base of high current NPN bipolar transistor Q6, acting as a pull-down device N-channel transistors Q3 and Q4 are used to prevent a full high level input voltage (e.g., 5 volts) from being directly applied to the base of bipolar pull-down transistor Q6. Bipolar transistors Q5 and Q6 are connected in series between supply voltage terminal 10 and ground terminal 12. The output of the driver circuit comprising bipolar transistors Q5 and Q6 is at the common node of transistors Q5 and Q6.

Thus, when an input signal applied to input terminal 8 is high, this high signal will be inverted by the CMOS device, and bipolar transistor Q5, as well as N-channel transistor Q4, will be off. The high input signal applied to the gate of N-channel transistor Q3 will turn transistor Q3 on as well as turn bipolar transistor Q6 on, since the source of transistor Q3 will rise with an increased gate voltage. Thus, output terminal 16 will be pulled down to approximately 0.7 volts.

Conversely, when the input signal applied to input terminal 8 is low, transistor Q5 will turn on, while transistor Q6 will turn off, causing a high voltage to be applied to output terminal 16.

In a programmable BiCMOS gate array, the driver circuits may be located in each cell or remote from the CMOS transistors. The driver circuits may or may not be used for a specific configuration of the CMOS gates, depending on whether the CMOS gates themselves provide a sufficiently high output current to adequately drive a subsequent stage. Thus, in addition to the conventional bipolar driver circuits using a large portion of the die area due to the size of the bipolar transistors and due to the additional MOSFETs needed to prevent a full high level input voltage from being directly applied to the base of the bipolar pull-down transistor, many of these driver circuits may not even be required for a specific application, leaving a large portion of the die area unused.

Accordingly, it would be desirable to incorporate driver circuits in integrated circuits which require a minimum of die area but still possess fast switching speeds and high current capability.

SUMMARY OF THE INVENTION

A novel, high switching speed, driver circuit for use with a CMOS or other low power device is disclosed herein, wherein the driver circuit comprises a single pull-up bipolar transistor and a single N-channel pull-down MOSFET. In one embodiment of the inventive circuit, a low power CMOS device inverts an input signal and provides this inverted input signal into the base of an NPN bipolar transistor whose collector is coupled to a positive power supply voltage. The input signal coupled to the input of the CMOS device is also coupled to the gate of a large N-channel MOSFET having its drain coupled to the emitter of the bipolar transistor and its source coupled to ground. The common node of the bipolar transistor and the N-channel MOSFET provides the output signal of the driver.

Hence, an input signal into the CMOS device is directly coupled to the gate of the N-channel pull-down MOSFET, while an inverted input signal is coupled to the base of the bipolar transistor, so that the bipolar transistor and the N-channel MOSFET always assume opposite states to provide a high or low output signal with very low leakage current passing from the power supply terminal to ground through the bipolar transistor and the N-channel MOSFET.

This driver is inherently smaller than prior art BiCMOS drivers since the driver requires fewer transistors to operate, and its performance is comparable to standard BiCMOS drivers. Additional advantages of this novel driver circuit are discussed below.

BRIEF DESCRIPTION OF THE DRAWINGS

FIG. 2b shows an equivalent circuit of FIG. 2a.

DETAILED DESCRIPTION OF THE PREFERRED EMBODIMENT

Figure 2A:
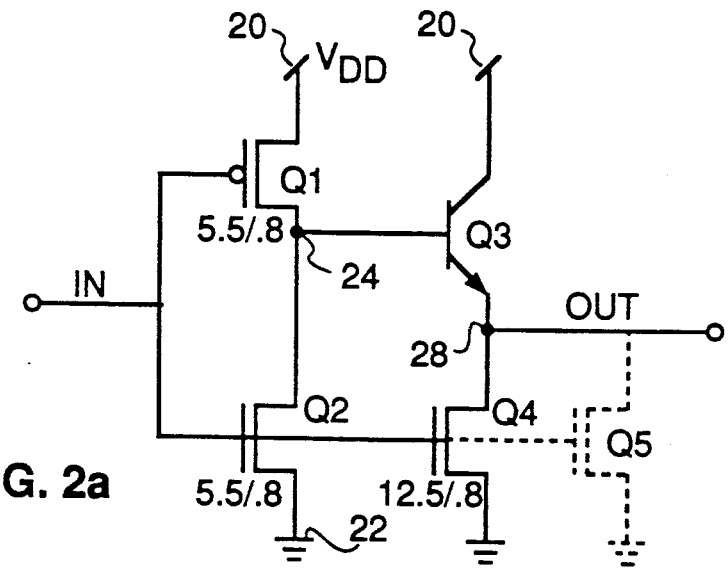
FIG. 2a shows one embodiment of a circuit using the inventive BiNMOS driver circuit.

The preferred embodiment of the invention is shown in FIG. 2a and also described in the paper entitled "BiNMOS: A Basic Cell For BiCMOS-Sea-Of-Gates," by A. El Gamal et al., dated May 15, 1989. This article is incorporated herein by reference.

The circuit of FIG. 2a comprises a logic portion, comprising CMOS transistors Q1 and Q2, and a drive portion, comprising bipolar transistor Q3 and N-channel transistor Q4. In FIG. 2a, an input signal is applied to the gates of P-channel transistor Q1 and N-channel transistor Q2, connected as a CMOS device between power supply terminal 20 and ground terminal 22. The common node of transistors Q1 and Q2 at terminal 24 provides an input signal into the base of NPN bipolar pull-up transistor Q3. The input signal applied to the gates of transistors Q1 and Q2 is also directly applied to the gate of N-channel transistor Q4 so that the signal applied to the base of transistor Q3 is inverted from the signal applied to the gate of transistor Q4.

The collector of transistor Q3 is coupled to power supply terminal 20, while the emitter of transistor Q3 is coupled to the drain of transistor Q4. The source of transistor Q4 is coupled to ground terminal 22. The emitter of transistor Q3 provides an output signal at terminal 28.

In operation, a high logic level input signal coupled to the gates of transistors Q1 and Q2 turns N-channel transistor Q2 on and P-channel transistor Q1 off. This causes a low voltage to be applied to the base of transistor Q3, turning transistor Q3 off. The high logic level input signal applied to the gate of N-channel transistor Q4 turns transistor Q4 on. Thus, the output at terminal 28 will be shorted to ground.

The pull-down delay time of N-channel transistor Q4 will approach that of a bipolar transistor if the parasitic capacitance seen at terminal 28 is sufficiently low. Using transistors having sizes indicated in FIG. 2a, where the widths and lengths of the MOSFET channels are given in microns, transistor Q4 exhibits a pull-down delay time approximately equal to that of a bipolar pull-down transistor in a BiCMOS driver for an output capacitance of less than approximately 0.4 pF (see FIG. 2c).

In the event the capacitive loading at terminal 28 is of a sufficient magnitude to cause transistor Q4 to have an unacceptable switching speed, a parallel N-channel transistor Q5 may be connected in a manner identical to the connection of transistor Q4. Using transistor Q5, the pull-down delay of the driver is approximately that of a bipolar pull-down transistor in a BiCMOS driver for an output capacitance of less than approximately 2.0 pF. Transistor Q5 is shown in dashed outline to indicate that it is optional. Of course, N-channel transistor Q4 can be made larger to increase its speed in pulling down output terminal 28.

The size of transistor Q4 is dictated by its desired switching speed, given a certain anticipated capacitance at output terminal 28, whereby transistor Q4 must be designed to short to ground a sufficient percentage of the charge stored in the parasitic capacitor as seen at terminal 28 within a certain predetermined period of time.

Figure 2B:
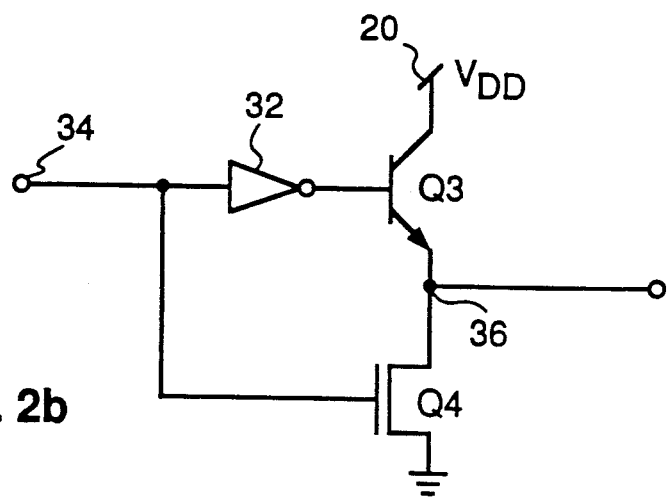

FIG. 2b shows an equivalent circuit of the circuit of FIG. 2a, where transistors Q1 and Q2 in FIG. 2a are represented by inverter 32, while transistors Q3 and Q4 are connected as described with respect to FIG. 2a. An input signal is applied to terminal 34 in FIG. 2b, while an output signal is taken from terminal 36.

Figure 1:
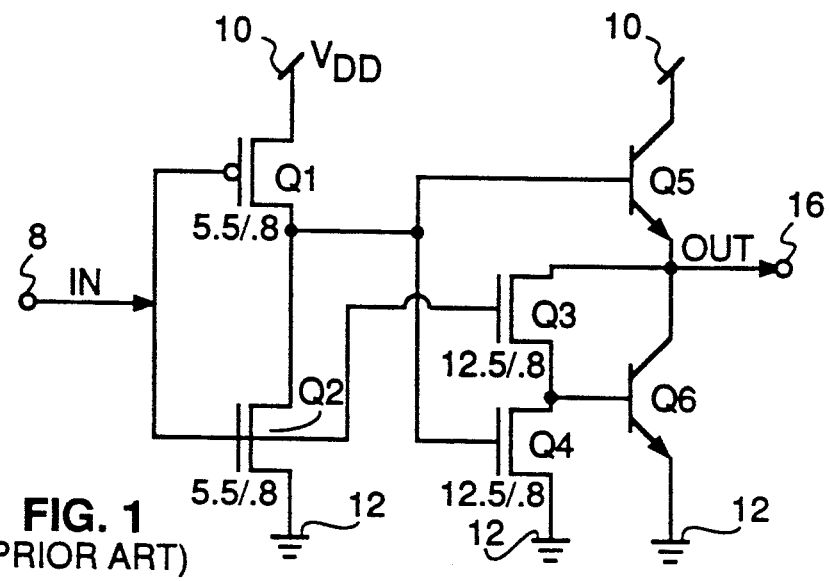
FIG. 1 shows a prior art BiCMOS circuit using bipolar pull-down and pull-up transistors.
Figure 2C:
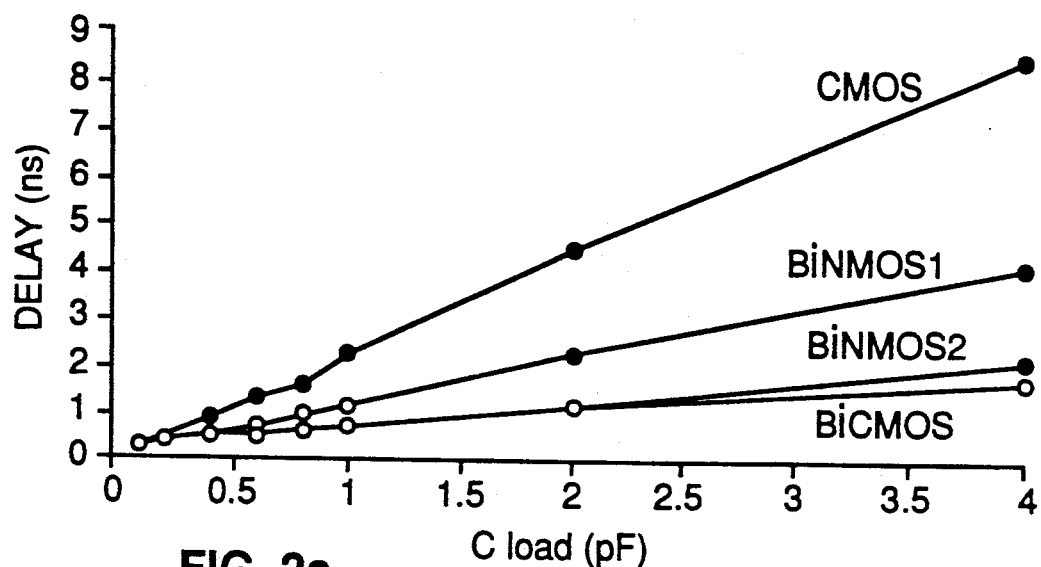
FIG. 2c is a graph showing delay vs. capacitance for different types of driver circuits.

FIG. 2c is a graph of switching delay vs. load capacitance for: 1) a CMOS device (channel width 12.5$\mu$, channel length 0.8$\mu$); 2) the BiCMOS device of FIG. 1; 3) the device of FIG. 2a (BiNMOS1) using only Q4; and 4) the device of FIG. 2a (BiNMOS2) using Q4 and Q5.

Since the die area required for implementing the inverter logic and driver circuit of FIG. 2a, using four transistors, is relatively small as compared to the die area required for implementing the inverter logic and driver circuit of FIG. 1, using six transistors, and these circuits having equivalent delay times for medium to low capacitances, programmable gate arrays incorporating the driver circuit of FIG. 2a may devote less area to driver circuits and more area to logic circuits.

The designers of prior art BiCMOS circuits have not appreciated the fact that an N-channel pull-down MOSFET can replace the pull-down bipolar transistor of a standard two-bipolar transistor BiCMOS configuration without any significant loss of performance, since it was previously believed that a bipolar pull-down transistor was required to match the high switching speed characteristics of the bipolar pull-up transistor. However, results of circuit simulation were used by Applicant to obtain delay versus capacitive loading characteristics for the BiNMOS1 and BiNMOS2 inverters (both shown in FIG. 2a) and the BiCMOS inverter of FIG. 1, which revealed that the pull-down time for the BiNMOS1 inverter is shorter than or comparable to the pull-down time for the BiCMOS inverter, given a capacitive loading of less than approximately 0.4 pF, and that the pull-down time for the BiNMOS2 inverter is shorter than or comparable to the pull-down time for the BiCMOS inverter, given a capacitive loading of less than approximately 2 pf. On the other hand, the pull-up time of the P-channel transistor of the CMOS device is significantly longer than the pull-up time of the BiCMOS inverter even for low capacitive loading, due to the slower mobility of holes through the P-channel transistor.

Given a statistical distribution of net capacitance loading for typical gate array applications, it was seen by circuit simulation that more than 90 percent of the nets do not require a bipolar pull-down transistor, since the capacitive loading for these nets is less than approximately 2 pF. Therefore, although a bipolar pull-up transistor greatly improves performance, a bipolar pull-down transistor is only optionally needed for driving less than 10 percent of the nets in a typical gate array application.

Thus, by replacing the bipolar pull-down transistor in a BiCMOS device with a large N-channel MOSFET and eliminating MOSFETs used to buffer the base of the bipolar pull-down transistor, significantly less area is required for the driver circuit without a sacrifice in performance. Since, in a typical BiCMOS programmable gate array, pull-up and pull-down bipolar driver transistors are incorporated in every cell, despite there being a likelihood of only low capacitive loading, the substitution of an N-channel pull-down driver transistor for a pull-down bipolar transistor results in a significant reduction in the die area required for drivers.

This novel device, termed a BiNMOS driver, also has the advantage of pulling an output terminal to ground with no threshold voltage drop.

Figure 3:
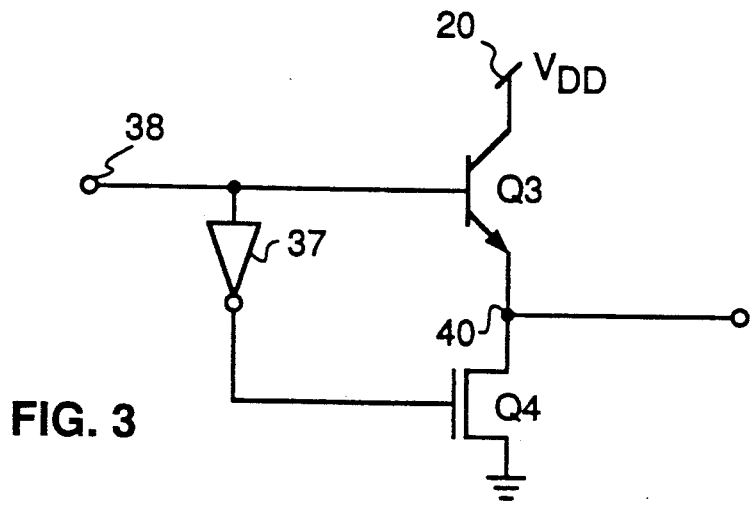
FIG. 3 shows an alternative embodiment of a circuit using the BiNMOS driver circuit.

As an alternative embodiment to the circuit of FIGS. 2a and 2b, as shown in FIG. 3, an inverter 37 may be placed between input terminal 38 and the gate of N-channel transistor Q4, while the base of transistor Q3 is coupled directly to input terminal 38. Thus, in the configuration shown in FIG. 3, the output signal at terminal 40 would be a noninverted representation of the input signal applied to input terminal 38.

Figure 4:
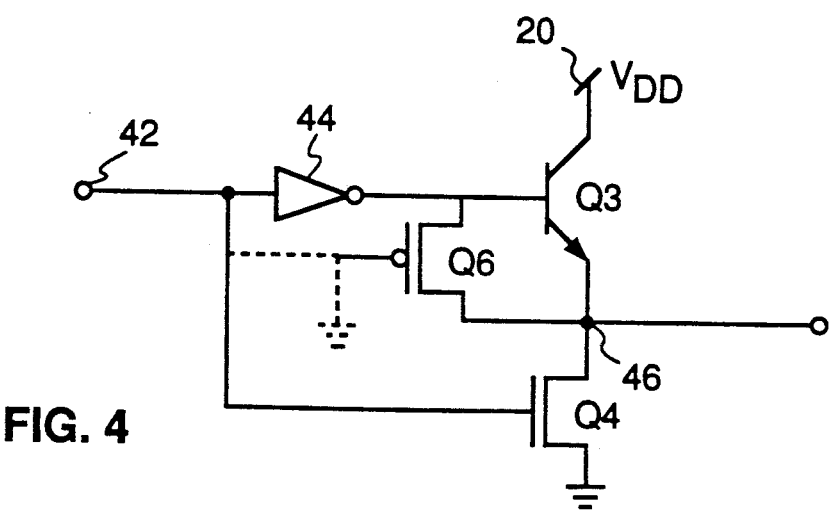
FIG. 4 shows an alternative embodiment of a circuit using the BiNMOS driver circuit.

FIG. 4 shows another embodiment of the invention where small P-channel MOS transistor Q6 is connected in parallel with the base and emitter of transistor Q3, where the gate of transistor Q6 is either coupled to input terminal 42 or to a ground terminal. Inverter 44, which may be a CMOS device, is coupled between terminal 42 and the base of transistor Q3. In the configuration of FIG. 4, when transistor Q6 is on, due to the output of inverter 44 being high, the full output voltage of inverter 44 is coupled to output terminal 46 via transistor Q6 instead of a voltage lowered by the $V_{BE}$ of transistor Q3.

Figure 5A:
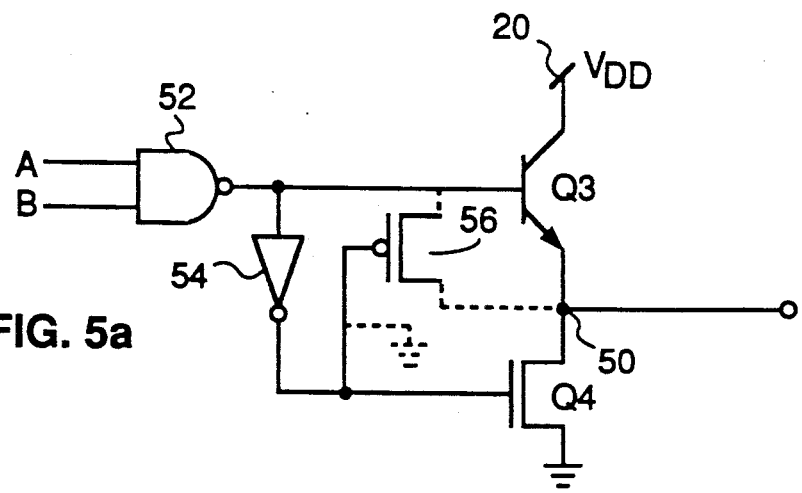
FIGS. 5a–5c show embodiments of the inventive BiNMOS driver circuit incorporated into a NAND gate.
Figure 5B:
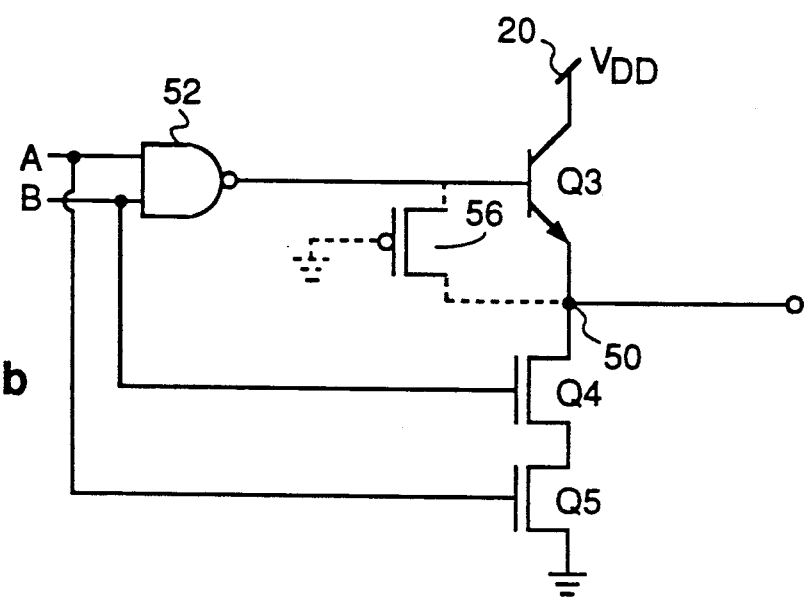
Figure 5C:
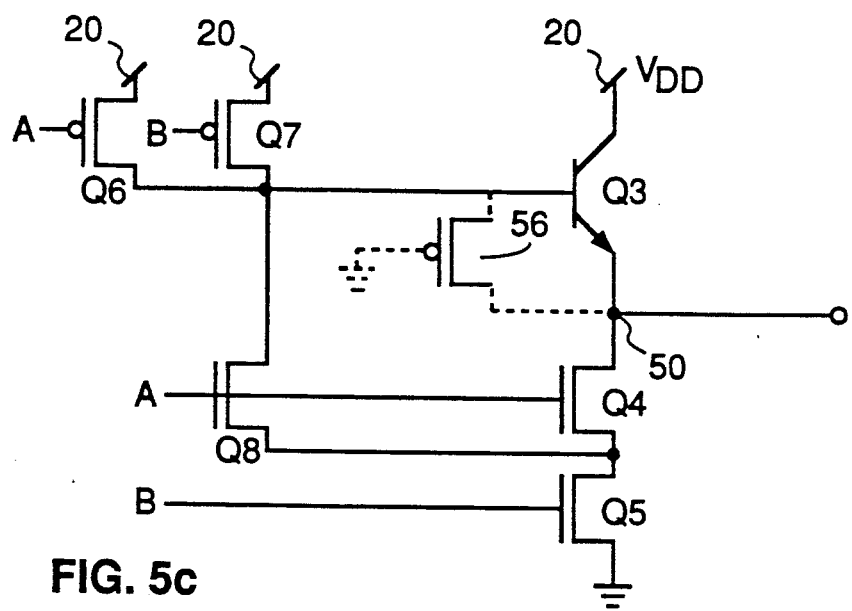

FIGS. 5a, 5b, and 5c show three separate NAND gate circuits using a BiNMOS driver having inputs A and B and an output at terminal 50. FIGS. 5a–5c are intended to illustrate the flexibility of the BiNMOS driver to accommodate a range of capacitances as seen at output terminal 50.

The NAND circuit of FIG. 5a is advantageous for outputs having a relatively high parasitic capacitance. In FIG. 5a, bipolar transistor Q3 and N-channel transistor Q4 together act as a non-inverting BiNMOS driver for the output of NAND gate 52, where the output of NAND gate 52 is coupled to the gate of transistor Q4 via inverter 54. Inverter 54 applies a relatively high power signal to the gate of transistor Q4 to cause transistor Q4 to quickly turn on. Small P-channel transistor 56 is coupled across the base and emitter of bipolar transistor Q3 and has its gate connected to either the output of inverter 54 or ground potential. Transistor 56 is thus turned on when a high voltage is applied to the base of transistor Q3 and serves to eliminate any $V_{BE}$ drop at output terminal 50 when the output is a logical high.

The circuit of FIG. 5b is beneficial for driving medium capacitive outputs, where inputs A and B into NAND gate 52 are also applied directly to the gates of N-channel transistors Q4 and Q5, coupled in series between the emitter of transistor Q3 and ground, to drive the output terminal 50 low only upon both signals A and B being of a high voltage. A separate inverter, such as inverter 54 in FIG. 5a, is not required, since input signals A and B are sufficient to adequately switch transistors Q4 and Q5. Thus, the switching delay of NAND gate 52 is avoided in pulling down output terminal 50. Small P-channel transistor 56 may be connected between the base and emitter of bipolar transistor Q3, with its gate connected to ground, to eliminate any $V_{BE}$ drop across transistor Q3 when the output at terminal 50 is a logical high.

The NAND gate circuit of FIG. 5c uses the least number of transistors and is most advantageous with low capacitive loading on output terminal 50. Pull-up P-channel transistors Q6 and Q7 have their gates coupled to receive input signals A and B, respectively, and have their sources coupled to the base of transistor Q3. N-channel transistor Q8 has its gate coupled to receive input signal A, its drain coupled to the base of transistor Q3, and its source coupled to the source of N-channel transistor Q4. The drain of transistor Q4 is coupled to the emitter of transistor Q3, and the source of transistor Q4 is coupled to ground through N-channel transistor Q5. The gate of transistor Q5 is coupled to receive input signal B. Small P-channel transistor 56 of FIG. 5b may similarly be used in the circuit of FIG. 5c to eliminate the $V_{BE}$ drop at output terminal 50.

The NAND circuit of FIG. 5c, since it uses very few transistors, requires very little die area. The circuit of FIG. 5b uses more transistors but drives a larger load, and the circuit of FIG. 5a, having a driver circuit similar to that of FIG. 3, contains the most transistors but drives a still larger capacitance load.

Besides a BiNMOS driver being smaller than a full BiCMOS driver, other advantages include the BiNMOS being faster for small to medium loads and faster than a BiCMOS driver for reduced output voltage swings. These advantages are additionally discussed in the article, "Future BiCMOS Technology For Scaled Supply Voltage," by Watanabe et al., published Dec. 30, 1989 in IEDM '89, which briefly discusses Applicant's BiNMOS circuit.

Additionally, the BiNMOS circuit is ideally suited to a sea of gates type programmable gate array integrated circuit, where a BiNMOS driver may be incorporated into each cell. Since a BiNMOS driver uses significantly less area than a two-bipolar transistor driver, the inclusion of a BiNMOS driver in each cell enables each cell to be made smaller than cells incorporating a two-bipolar transistor driver. If additional pull-down capability is desired, other N-channel MOSFETs within the cell may be connected in parallel with the N-channel pull-down driver transistor. Further, since a BiNMOS driver is to be included in each cell, the other CMOS components in the cell may be made smaller than prior art CMOS components. The BiNMOS driver would then be typically used as an output buffer for each cell, thus fully utilizing the BiNMOS drivers and minimizing the size of other components within the cell.

Manufacturers of Application Specific Integrated Circuits (ASIC), which include programmable gate arrays (e.g., sea-of-gates type circuits) and standard cell type circuits, publish macrocell libraries identifying standard logic circuits (macrocells) which may be created or are included in the ASIC. This macrocell library identifies for each macrocell the connections between transistors or other components within one or more cells necessary to create the macrocell By using small size CMOS components in each cell and including Applicant's BiNMOS driver in most or all cells, the BiNMOS driver would be used to drive the output of most macrocells. For example, a typical latch circuit in a macrocell library may resemble the circuit shown in FIG. 6, where transistors Q3 and Q4 operate as the BiNMOS driver.

Figure 6:
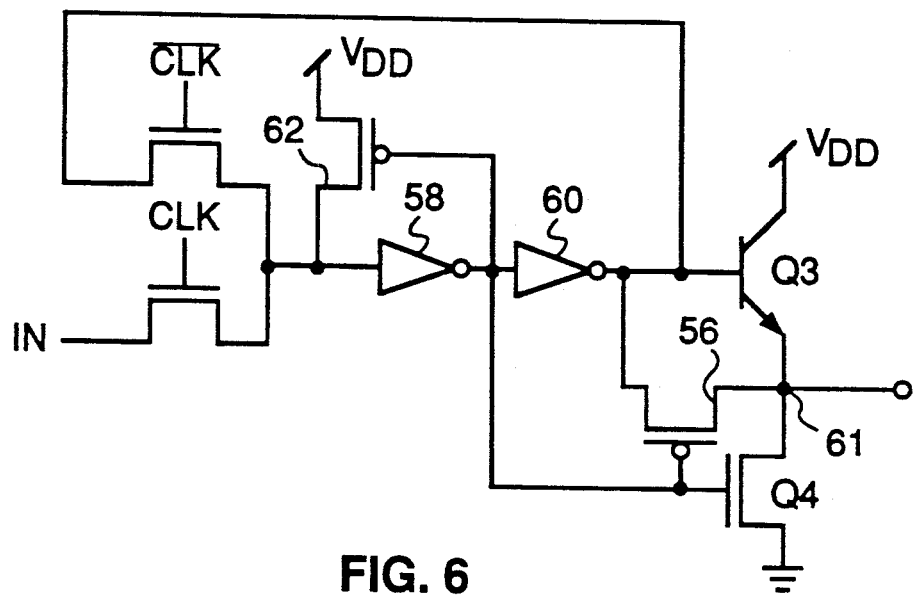
FIG. 6 illustrates one type of logic circuit which uses the BiNMOS driver, which may be included in a macrocell library.

In FIG. 6, input signal IN is applied to the input of inverter 58 upon an occurrence of a high CLK signal. Assuming input signal IN is high upon the occurrence of a high CLK signal, the inverted signal at the output of inverter 58 is applied to the gate of N-channel transistor Q4, turning transistor Q4 off. The inverted output of inverter 58 is inverted by inverter 60 so as to apply a high signal to the base of bipolar transistor Q3, turning transistor Q3 on and providing a high output signal at output terminal 61.

Upon the occurrence of a high $\overline{CLK}$ signal, a feedback path is created which couples the voltage applied to the base of transistor Q3 to the input of inverter 58, thus creating a latched output until input signal IN is changed and a high CLK signal occurs.

P-channel transistor 56 eliminates the $V_{BE}$ drop across transistor Q3 when the output at terminal 61 is a logical high. P-channel transistor 62 causes the full power supply voltage to be applied to the input of inverter 58 when the output of inverter 58 is low.

The BiNMOS driver may also be used in a tristate output configuration wherein, in addition to the output being driven high or low, a high impedance state may be generated by applying a low signal to the base of the bipolar pull-up transistor and the gate of the N-channel pull-down transistor.

Figure 7:
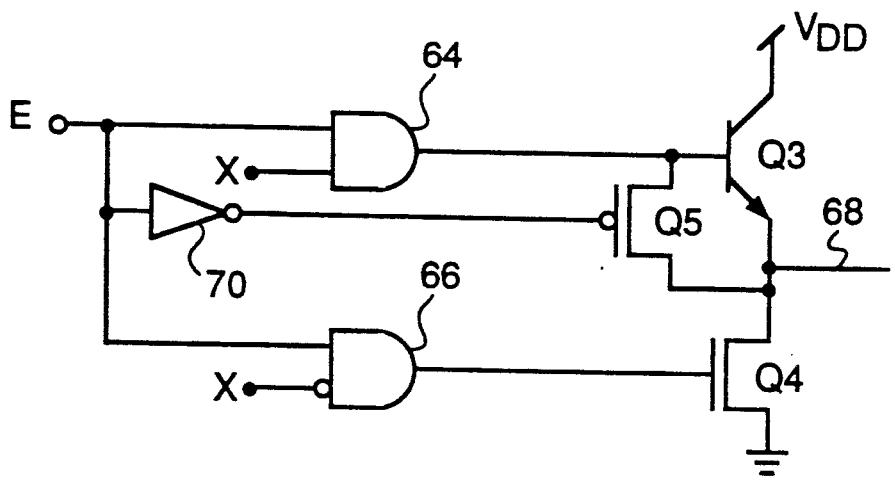
FIG. 7 illustrates a three state logic circuit which uses the BiNMOS driver.

One such tristate device is shown in FIG. 7. In FIG. 7, if enable signal E is low, the outputs of AND gates 64 and 66 will be low, causing transistors Q3 and Q4 to both be off and causing a high impedance to appear at output 68. If enable signal E is high, the output signal at output 68 will correspond to the state of control signal X. P-channel transistor Q5 causes the signal at output 64 to be at a fully high voltage, and not lowered by $V_{BE}$, when both signals E and X are high. Inverter 70 causes the gate of transistor Q5 to be low only when enable signal E is high.

The driver circuits in FIGS. 2-7 are preferably formed with the NPN bipolar transistor and the P-channel transistors in the same N-well to minimize die area. Additionally, multiple parallel emitters are preferably used to conduct a greater current. The circuits of FIGS. 2-7 may be fabricated using any technology, such as Signetics' Sabre and HS4 technologies.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of the invention.

What is claimed is:

1. A BiCMOS binary logic circuit for performing logical operations comprising:
   a pull-up bipolar transistor having a collector coupled to a first power supply terminal, having an emitter for providing a logic circuit output signal, and having a base coupled to receive a first input signal;
   one or more pull-down N-channel transistors, each of said N-channel transistors having its drain coupled to said emitter of said bipolar transistor and its source coupled to a second power supply terminal, a gate of each of said N-channel transistors being coupled to receive a second input signal; and
   a CMOS binary logic circuit having one or more input terminals and coupled to said base of said bipolar transistor and to said gate of each of said N-channel transistors, said CMOS binary logic circuit operating to cause said first input signal to be of a logic state opposite that of said second input signal,
   said BiCMOS binary logic circuit being connected within an integrated circuit so as not to buffer input signals applied to terminals of said integrated circuit or buffer output signals applied to terminals of said integrated circuit.

2. The BiCMOS circuit of claim 1 wherein said one or more pull-down N-channel transistors comprises one N-channel transistor.

3. The BiCMOS circuit of claim 1 further comprising a P-channel transistor having its source coupled to said base of said bipolar transistor, its drain coupled to said emitter of said bipolar transistor, and its gate coupled to receive said second input signal.

4. The BiCMOS circuit of claim 1 further comprising a P-channel transistor having its source coupled to said base of said bipolar transistor, its drain coupled to said emitter of said bipolar transistor, and its gate coupled to said second power supply terminal.

5. The BiCMOS circuit of claim 1 wherein said CMOS binary logic circuit is an inverter having an output coupled to said base of said bipolar transistor and an input coupled to receive said second input signal.

6. The BiCMOS circuit of claim 5 further comprising a P-channel transistor having its source coupled to said base of said bipolar transistor, its drain coupled to said emitter of said bipolar transistor, and its gate coupled to receive said second input signal.

7. The BiCMOS circuit of claim 5 further comprising a P-channel transistor having its source coupled to said base of said bipolar transistor, its drain coupled to said emitter of said bipolar transistor, and its gate coupled to said second power supply terminal.

8. The BiCMOS circuit of claim 1 wherein said CMOS binary logic circuit is an inverter having an output coupled to said gate of each of said one or more N-channel transistors and an input coupled to receive said first input signal.

9. The BiCMOS circuit of claim 8 further comprising a P-channel transistor having its source coupled to said base of said bipolar transistor, its drain coupled to said emitter of said bipolar transistor, and its gate coupled to receive said second input signal.

10. The BiCMOS circuit of claim 8 further comprising a P-channel transistor having its source coupled to said base of said bipolar transistor, its drain coupled to said emitter of said bipolar transistors, and its gate coupled to said second power supply terminal.

11. The BiCMOS circuit of claim 8 wherein a NAND gate has an output connected to said base of said bipolar transistor and also connected to an input of said inverter.

12. A BiCMOS binary logic circuit comprising:
   a pull-up bipolar transistor having a collector terminal coupled to a first power supply terminal, having an emitter for providing a logic circuit output signal, and having a base coupled to receive a first input signal;
   a first N-channel transistor having its drain coupled to said emitter of said bipolar transistor, having a gate coupled to receive a second input signal, and having a source terminal;
   a second N-channel transistor having its drain coupled to said source terminal of said first N-channel transistor and having its source coupled to a second power supply terminal, a gate of said second N-channel transistor being coupled to receive a third input signal; and
   a NAND gate having its output terminal coupled to said base of said bipolar transistor, said NAND gate having a first input terminal coupled to said gate of said first N-channel transistor, and having a second input terminal coupled to said gate of said second N-channel transistor.

13. The BiCMOS circuit of claim 12 further comprising a P-channel transistor having its source coupled to said base of said bipolar transistor, its drain coupled to said emitter of said bipolar transistor, and its gate coupled to said second power supply terminal.

14. The BiCMOS circuit of claim 12 wherein said NAND gate comprises;
   a first P-channel transistor having its source connected to said first power supply terminal, having a gate coupled to receive said second input signal, and having a drain coupled to said base of said bipolar transistor;
   a second P-channel transistor having its source coupled to said first power supply terminal, having a gate coupled to receive said third input signal, and having its drain coupled to said base of said bipolar transistor; and
   a third N-channel transistor having its drain coupled to said base of said bipolar transistor, having a gate coupled to receive said second input signal, and having its source coupled to said drain of said second N-channel transistor, wherein said gate of said second N-channel transistor is coupled to receive said third input signal.

15. A driver portion of a BiCMOS binary logic circuit comprising:
   a pull-up bipolar transistor having a collector terminal coupled to a first power supply terminal, having an emitter for providing a logic circuit output signal, and having a base coupled to receive a first input signal; and
   one or more N-channel transistors coupled between said emitter of said bipolar transistor and a second power supply terminal, said N-channel transistors being coupled in series and/or in parallel, gates of said N-channel transistors being coupled to receive associated input signal which cause one or more of said N-channel transistors to create a low impedance path between said emitter and said second power terminal when said bipolar transistor is in an off state and which cause said N-channel transistors to create a high impedance path between said emitter and said second power supply terminal when said bipolar transistor is in an on state, said BiCMOS binary logic circuit being connected within an integrated circuit so as not to buffer input signals applied to terminals of said integrated circuit or buffer output signals applied to terminals of said integrated circuit.

16. The driver portion of claim 15 further comprising a P-channel transistor having its source coupled to said base of said bipolar transistor, its drain coupled to said emitter of said bipolar transistor, and its gate coupled to receive a second input signal, said second input signal being low when said first input signal is high.

17. In an Application Specific Integrated Circuit (ASIC), a plurality of logic circuit macrocells not being input/output buffers for said ASIC, one or more of said macrocells comprising;
   a pull-up bipolar transistor having a collector coupled to a first power supply terminal, having an emitter for providing a driver circuit output signal, and having a base coupled to receive a first input signal;
   one or more pull-down N-channel transistors, each of said N-channel transistors having its drain coupled to said emitter of said bipolar transistor and its source coupled to a second power supply terminal, a gate of each of said N-channel transistors being coupled to receive a second input signal; and
   a CMOS binary logic circuit having one or more input terminals and coupled to said base of said bipolar transistor and to said gate of each of said N-channel transistors, said CMOS binary logic circuit operating to cause said first input signal to be of a logic state opposite that of said second input signal.

18. The one or more macrocells of claim 17 further comprising a P-channel transistor having its source coupled to said base of said bipolar transistor, its drain coupled to said emitter of said bipolar transistor, and its gate coupled to receive said second input signal.

19. The one or more macrocells of claim 17 wherein said CMOS binary logic circuit is an inverter having an output coupled to said base of said bipolar transistor and an input coupled to receive said second input signal.

20. The one or more macrocells of claim 17 wherein said CMOS binary logic circuit is an inverter having an output coupled to said gate of each of said one or more N-channel transistors and an input coupled to receive said first input signal.

21. In an Application Specific Integrated Circuit (ASIC), a plurality of logic circuit macrocells not being input/output buffers for said ASIC, one or more of said macrocells comprising:
   a pull-up bipolar transistor having a collector terminal coupled to a first power supply terminal, having an emitter for providing a driver circuit output signal, and having a base coupled to receive a first input signal;
   one or more N-channel transistors coupled between said emitter of said bipolar transistor and a second power supply terminal, said N-channel transistors being coupled in series and/or in parallel, gates of said N-channel transistors being coupled to receive associated input signals which cause one or more of said N-channel transistors to create a low impedance path between said emitter and said second power terminal when said bipolar transistor is in an off state and which cause said N-channel transistors to create a high impedance path between said emitter and said second power supply terminal when said bipolar transistor is in an on state; and a CMOS binary logic circuit having one or more input terminals and coupled to said base of said bipolar transistor and to said gate of each of said N-channel transistors, said CMOS binary logic circuit operating to cause said first input signal to be of a logic state opposite that of said second input signal.

22. The one or more macrocells of claim 21 further comprising a P-channel transistor having its source coupled to said base of said bipolar transistor, its drain coupled to said emitter of said bipolar transistor, and its gate coupled to receive a second input signal, said second input signal being low when said first input signal is high.

23. A latch circuit comprising:
a pull-up bipolar transistor having a collector coupled to a first power supply terminal, having an emitter for providing a logic circuit output signal, and having a base;
a pull-down N-channel transistor having its drain coupled to said emitter of said bipolar transistor, having its source to coupled to a second power supply terminal, and having a gate;
a first inverter having an output coupled to said base of said bipolar transistor and an input coupled to said gate of said N-channel transistor;
a second inverter having an output coupled to said input of said first inverter;
a P-channel transistor having a source coupled to said first power supply terminal, having a drain coupled to an input of said second inverter, and having a gate coupled to said output of said second inverter;
a first N-channel transistor having a first terminal coupled to said base of said bipolar transistor, a second terminal coupled to said input of said second inverter, and a gate coupled to receive a first clock signal; and
a second N-channel transistor having a first terminal coupled to said input of said second inverter, a second terminal coupled to receive a latch input signal, and a gate coupled to receive a second clock signal of a state opposite said first clock signal.

24. The latch circuit of claim 23 further comprising a P-channel transistor having its source coupled to said base of said bipolar transistor, its drain coupled to said emitter of said bipolar transistor, and its gate coupled to said gate of said pull down N-channel transistor.

25. A tristate BiCMOS logic circuit comprising:
a pull-up bipolar transistor having a collector coupled to a first power supply terminal, having an emitter for providing a logic circuit output signal, and having a base coupled to receive a first input signal;
one or more pull-down N-channel transistors, each of said N-channel transistors having its drain coupled to said emitter of said bipolar transistor and its source coupled to a second power supply terminal, a gate of each of said N-channel transistors being coupled to receive a second input signal;
means to control said logic circuit output signal to be a logical high, logical low, or a high impedance; and
a P-channel transistor having its source coupled to said base of said bipolar transistor, its drain coupled to said emitter of said bipolar transistor, and its gate coupled to receive a third input signal.

26. The BiCMOS logic circuit of claim 25 wherein said logic circuit is connected within an integrated circuit so as not to buffer input signals applied to terminals of said integrated circuit or buffer output signals applied to terminals of said integrated circuit.

* * * * *

REEXAMINATION CERTIFICATE (1966th)
United States Patent [19]
El Gamel

[11] B1 5,068,548
[45] Certificate Issued  Mar. 30, 1993

[54] BICMOS LOGIC CIRCUIT FOR ASIC APPLICATION

[75] Inventor: Abbas El Gamel, Palo Alto, Calif.

[73] Assignee: SiArc, Palo Alto, Calif.

Reexamination Request:
No. 90/002,603, Feb. 14, 1992

Reexamination Certificate for:
Patent No.: 5,068,548
Issued: Nov. 26, 1991
Appl. No.: 524,207
Filed: May 15, 1990

[51] Int. Cl.$^5$ .................. H03K 19/01; H03K 19/003; H03K 19/082; H03K 19/094
[52] U.S. Cl. .................. 307/446; 307/570; 307/469; 364/716
[58] Field of Search ............ 307/446, 451, 465, 465.1, 307/469, 473, 510, 272.2, 303.1; 357/42, 43, 45

[56] References Cited
U.S. PATENT DOCUMENTS

| | | |
|---|---|---|
| 4,649,294 | 3/1987 | McLaughlin ............ 307/446 |
| 4,682,202 | 7/1987 | Tanizawa ............ 357/45 |
| 4,689,503 | 8/1987 | Suzuki et al. ............ 307/446 |
| 4,804,686 | 2/1989 | Masuda et al. ............ 307/446 |
| 5,047,669 | 9/1991 | Iwamura et al. ............ 307/446 |
| 5,055,716 | 10/1991 | Gamel ............ 307/466 |

*Primary Examiner*—D. R. Hudspeth

[57] ABSTRACT

In one embodiment of the invention, an inverter inverts an input signal and provides this inverted input signal into the base of an NPN bipolar transistor, acting as a pull-up device, whose collector is coupled to a positive power supply voltage. The input signal coupled to the input of the inverter is also coupled to the gate of a large N-channel MOSFET, acting as a pull-down device, having its drain coupled to the emitter of the bipolar transistor and its source coupled to ground. The common node of the bipolar transistor and the N-channel MOSFET provides the output signal of the driver. This driver uses much less area than a standard two-bipolar transistor BiCMOS driver with substantially equal performance. A small P-channel MOSFET having its gate connected to the input signal may be connected across the base and emitter of the bipolar transistor to provide a full output voltage at the output of the driver.

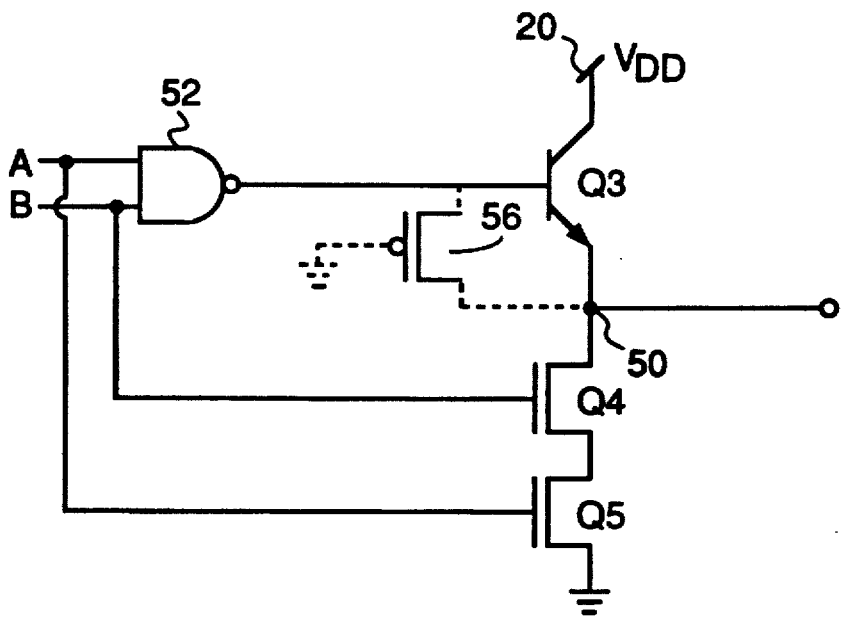

REEXAMINATION CERTIFICATE ISSUED UNDER 35 U.S.C. 307

THE PATENT IS HEREBY AMENDED AS INDICATED BELOW

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 23-26 is confirmed.

Claims 12 and 17-20 are cancelled.

Claims 1, 13-15 and 21 are determined to be patentable as amended.

Claims 2-11, 16 and 22, dependent on an amended claim, are determined to be patentable.

1. A BiCMOS binary logic circuit [for performing logical operations] *within a programmed gate array, said gate array comprising a plurality of cells, said logic circuit* comprising:
   a pull-up bipolar transistor having a collector coupled to a first power supply terminal, having an emitter for providing a logic circuit output signal, and having a base coupled to receive a first input signal;
   one or more pull-down N-channel transistors, each of said N-channel transistors having its drain coupled to said emitter of said bipolar transistor and its source coupled to a second power supply terminal, a gate of each of said N-channel transistors being coupled to receive a second input signal; and
   a CMOS binary logic circuit having one or more input terminals and coupled to said base of said bipolar transistor and to said gate of each of said N-channel transistors, said CMOS binary logic circuit operating to cause said first input signal to be of a logic state opposite that of said second input signal,
   [said BiCMOS binary logic circuit being connected within an integrated circuit so as not to buffer input signals applied to terminals of said integrated circuit or buffer output signals applied to terminals of said integrated circuits]
   *said bipolar transistor and said one or more N-channel transistors being formed in substantially each cell internal to said gate array in an Application Specific Integrated Circuit, said one or more N-channel transistors being substantially larger than any other MOS transistors in said cell.*

13. *A BiCMOS binary logic circuit comprising:*
   *a pull-up bipolar transistor having a collector terminal coupled to a first power supply terminal, having an emitter for providing a logic circuit output signal, and having a base coupled to receive a first input signal;*
   *a first N-channel transistor having its drain coupled to said emitter of said bipolar transistor, having a gate coupled to receive a second input signal, and having a source terminal;*
   *a second N-channel transistor having its drain coupled to said source terminal of said first N-channel transistor and having its source coupled to a second power supply terminal, a gate of said second N-channel transistor being coupled to receive a third input signal;*
   *a NAND gate having its output terminal coupled to said base of said bipolar transistor, and NAND gate having a first input terminal coupled to said gate of said first N-channel transistor, and having a second input terminal coupled to said gate of said second N-channel transistor; and* [The BiCMOS circuit of claim 12 further comprising] a P-channel transistor having its source coupled to said base of said bipolar transistor, its drain coupled to said emitter of said bipolar transistor, and its gate coupled to said second power supply terminal.

14. The BiCMOS circuit of claim [12] *13* wherein said NAND gate comprises;
   a first P-channel transistor having its source connected to said first power supply terminal, having a gate coupled to receive said second input signal, and having a drain coupled to said base of said bipolar transistor;
   a second P-channel transistor having its source to said first power supply terminal, having a gate coupled to receive said third input signal, and having its drain coupled to said base of said bipolar transistor; and
   a third N-channel transistor having its drain coupled to said base of said bipolar transistor, having a gate coupled to receive said second input signal, and having its source coupled to said drain of said second N-channel transistor, wherein said gate of said second N-channel transistor is coupled to receive said third input signal.

15. A driver portion of a BiCMOS binary logic circuit *within a programmed gate array, said gate array comprising a plurality of cells, said driver portion* comprising:
   a pull-up bipolar transistor having a collector terminal coupled to a first power supply terminal, having an emitter for providing a logic circuit output signal, and having a base coupled to receive a first input signal; and
   [one or more] *a plurality of* N-channel transistors coupled between said emitter of said bipolar transistor and a second power supply terminal, said N-channel transistors being coupled in series and/or in parallel, gates of said N-channel transistors being coupled to receive associated input signal which cause one or more of said N-channel transistors to create a low impedance path between said emitter and said second power terminal when said bipolar transistor is in an off state and which cause said N-channel transistors to create a high impedance path between said emitter and said second power supply terminal when said bipolar transistor is in an on state,
   [said BiCMOS binary logic circuit being connected within an integrated circuit so as not to buffer input signals applied to terminals of said integrated circuit or buffer output signals applied to terminals of said integrated circuit]
   *said bipolar transistor and said plurality of N-channel transistors being formed in substantially each cell internal to said gate array in an Application Specific Integrated Circuit, said plurality of N-channel transistors being substantially larger than any other MOS transistors in said cell.*

21. In an Application Specific Integrated Circuit (ASIC) *comprising a programmed gate array, said gate array comprising a plurality of cells*, a plurality of logic circuit macrocells not being input/output buffers for said ASIC, one or more of said macrocells comprising:
- a pull-up bipolar transistor having a collector terminal coupled to a first power supply terminal, having an emitter for providing a driver circuit output signal, and having a base coupled to receive a first input signal;
- one or more N-channel transistors coupled between said emitter of said bipolar transistor and a second power supply terminal, said N-channel transistors being coupled in series and/or in parallel, gates of said N-channel transistors being coupled to received associated input signals which cause one or more of said N-channel transistors to create a low impedance path between said emitter and said second power terminal when said bipolar transistor is in an off state and which cause said N-channel transistors to create a high impedance path between said emitter and said second power supply terminal when said bipolar transistor is in an on state; and
- a CMOS binary logic circuit having one or more input terminals and coupled to said base of said bipolar transistor and to said gate of each of said N-channel transistors, said CMOS binary logic circuit operating to cause said first input signal to be of a logic state opposite that of said second input signal,

*said bipolar transistor and said one or more N-channel transistors being formed in substantially each cell internal to said gate array in said ASIC, said one or more N-channel transistors being substantially larger than any other MOS transistors in said cell.*

* * * * *